(12) United States Patent  (10) Patent No.: US 7,524,740 B1
Liu et al.  (45) Date of Patent: Apr. 28, 2009

(54) LOCALIZED STRAIN RELAXATION FOR STRAINED SI DIRECTLY ON INSULATOR

(75) Inventors: Yaocheng Liu, White Plains, NY (US); Devendra Kumar Sadana, Pleasantville, NY (US); Kern Rim, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/108,917

(22) Filed: Apr. 24, 2008

(51) Int. Cl.
 *H01L 21/36* (2006.01)
 *H01L 21/20* (2006.01)
(52) U.S. Cl. ............. 438/479; 438/480; 438/481; 438/482; 438/486; 438/507
(58) Field of Classification Search .......... None
 See application file for complete search history.

(56) References Cited

U.S. PATENT DOCUMENTS

| | | | |
|---|---|---|---|
| 5,888,885 A | 3/1999 | Xie | |
| 5,906,951 A | 5/1999 | Chu et al. | |
| 5,920,103 A | 7/1999 | Fulford et al. | |
| 6,059,895 A | 5/2000 | Chu et al. | |
| 6,310,367 B1 | 10/2001 | Yagishita et al. | |
| 6,380,108 B1 | 4/2002 | Linthicum et al. | |
| 6,429,061 B1 | 8/2002 | Rim | |
| 6,524,935 B1 | 2/2003 | Canaperi et al. | |

(Continued)

FOREIGN PATENT DOCUMENTS

JP 63-033846 2/1988

(Continued)

OTHER PUBLICATIONS

Haizhou Yin et al. "Uniaxial strain relaxation on ultra-thin strained-Si . . ." Solid-State and Integrated Circuit Technology, 2006. ICSICT 06. 8th Int Conf Oct. 2006, pp. 136-138.

(Continued)

*Primary Examiner*—Zandra V. Smith
*Assistant Examiner*—Khanh B Duong
(74) *Attorney, Agent, or Firm*—Thorne & Halajian, LLP

(57) ABSTRACT

A method of forming a localized region of relaxed Si in a layer of strained Si arranged within a strained silicon directly on insulator (SSDOI) semiconductor substrate is provided by the invention. The strained Si layer is formed on a buried oxide (BOX) layer disposed on a Si substrate base. The method includes depositing a nitride hard mask pattern above a region of the strained Si layer in which enhanced electron mobility is desired, leaving an unmasked region within the strained Si layer, and carrying out various other processing steps to modify and relax the unmasked portion of the strained region. The method includes growing an EPI SiGe region upon the unmasked region using pre-amorphization implantation, and forming a buried amorphous SiGe region in a portion of the EPI SiGe region, and an amorphous Si region, below the amorphous SiGe region. Then, using SPE regrowth, modifying the amorphous SiGe and amorphous Si regions to realize an SPE SiGe region and relaxed SPE Si layer. The SiGe region and the SPE SiGe region are etched, leaving the relaxed SPE Si region above the buried oxide layer. The nitride pattern is stripped.

2 Claims, 19 Drawing Sheets

U.S. PATENT DOCUMENTS

Figure 1A:
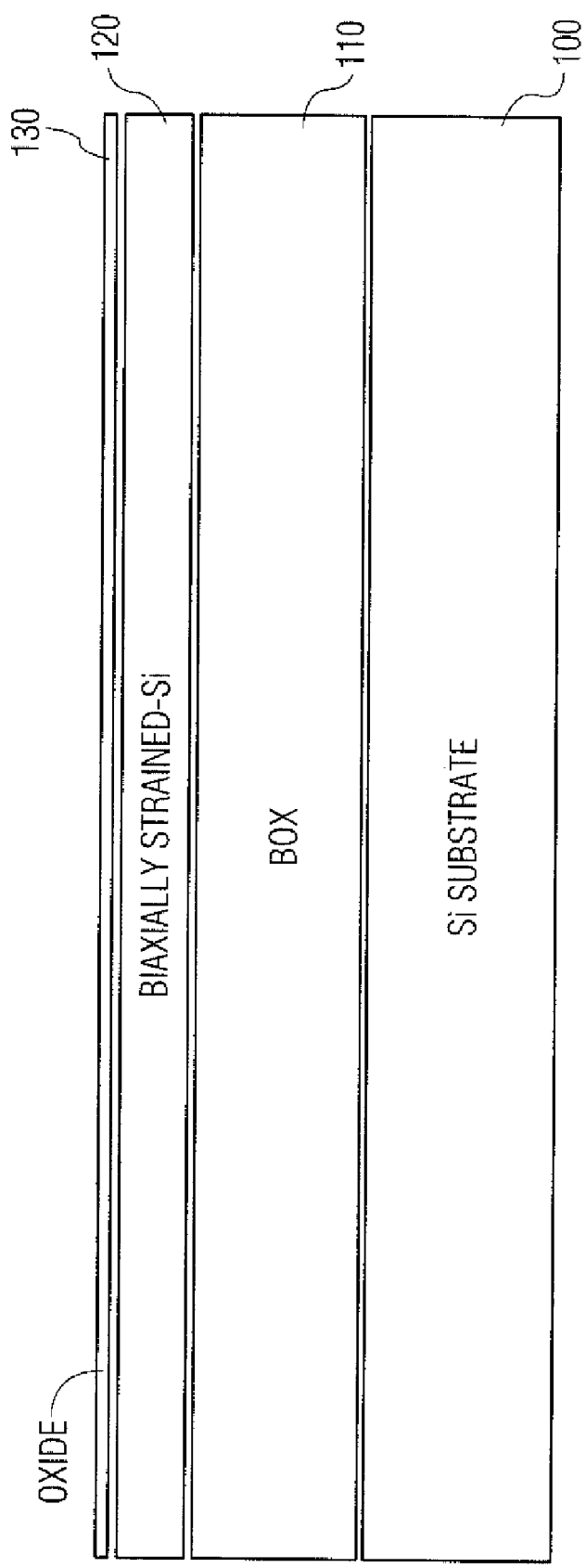

| | | | |
|---|---|---|---|
| 6,525,338 | B2 | 2/2003 | Mizushima et al. |
| 6,586,778 | B2 | 7/2003 | Linthicum et al. |
| 6,649,492 | B2 | 11/2003 | Chu et al. |
| 6,689,671 | B1 | 2/2004 | Yu et al. |
| 6,812,105 | B1 | 11/2004 | Dokumaci et al. |
| 6,815,738 | B2 | 11/2004 | Rim |
| 6,893,936 | B1 | 5/2005 | Chen et al. |
| 7,037,794 | B2 | 5/2006 | Beintner et al. |
| 7,067,430 | B2 | 6/2006 | Maa et al. |
| 7,217,949 | B2 | 5/2007 | Chan et al. |
| 7,223,994 | B2 | 5/2007 | Chidambarao et al. |
| 7,256,112 | B2 | 8/2007 | Chong et al. |
| 7,279,758 | B1 | 10/2007 | Li et al. |
| 7,282,402 | B2 * | 10/2007 | Sadaka et al. ............... 438/221 |
| 7,314,790 | B2 | 1/2008 | Chan et al. |
| 2005/0104156 | A1 | 5/2005 | Wasshuber |
| 2006/0011906 | A1 | 1/2006 | Bedell et al. |
| 2006/0244097 | A1 | 11/2006 | Wasshuber |
| 2007/0145481 | A1 | 6/2007 | Tilke et al. |
| 2007/0190741 | A1 | 8/2007 | Lindsay |
| 2007/0281413 | A1 | 12/2007 | Li et al. |

FOREIGN PATENT DOCUMENTS

| | | |
|---|---|---|
| JP | 63-124423 | 5/1988 |
| JP | 01-179448 | 7/1989 |
| JP | 04-134868 | 5/1992 |
| JP | 09-219524 | 8/1997 |
| JP | 2004-363197 | 12/2004 |

OTHER PUBLICATIONS

Aberg, I. et al. "Hole transport in UTB MOSFETs in strained-Si directly on insulator with . . . " Electron Device Letters, IEEE, Sep. 2005, vol. 26, Issue 9, pp. 661-663.

Bo Jin, Xi Wang, Jing Chen, Xinli Cheng, and Zhijun Chen "Fabrication of strained silicon on insulator by strain transfer process" Appl. Phys. Lett. 87, 051921 (2005).

Jin Cai et al. "Ultra-Low Leakage Silicon-on-Insulator Technology for 65 nm Node . . . " Electron Devices Meeting, 2007. IEDM 2007. IEEE International, Dec. 10-12, 2007, pp. 907-991.

Robert Harper "Epitaxial engineered solutions for ITRS scaling roadblocks" Materials Science and Engineering: B, Vo 134, Issues 2-3, Oct. 15, 2006, pp. 154-158.

Thean, Aaron "Strained Silicon Directly on Insulator (SSOI) . . . " SOI Technology and Devices 13, 211th ECS Meeting, May 6-May 10, 2007, pp. 287-293, Chicago, IL, vol. 6, Issue 4.

* cited by examiner

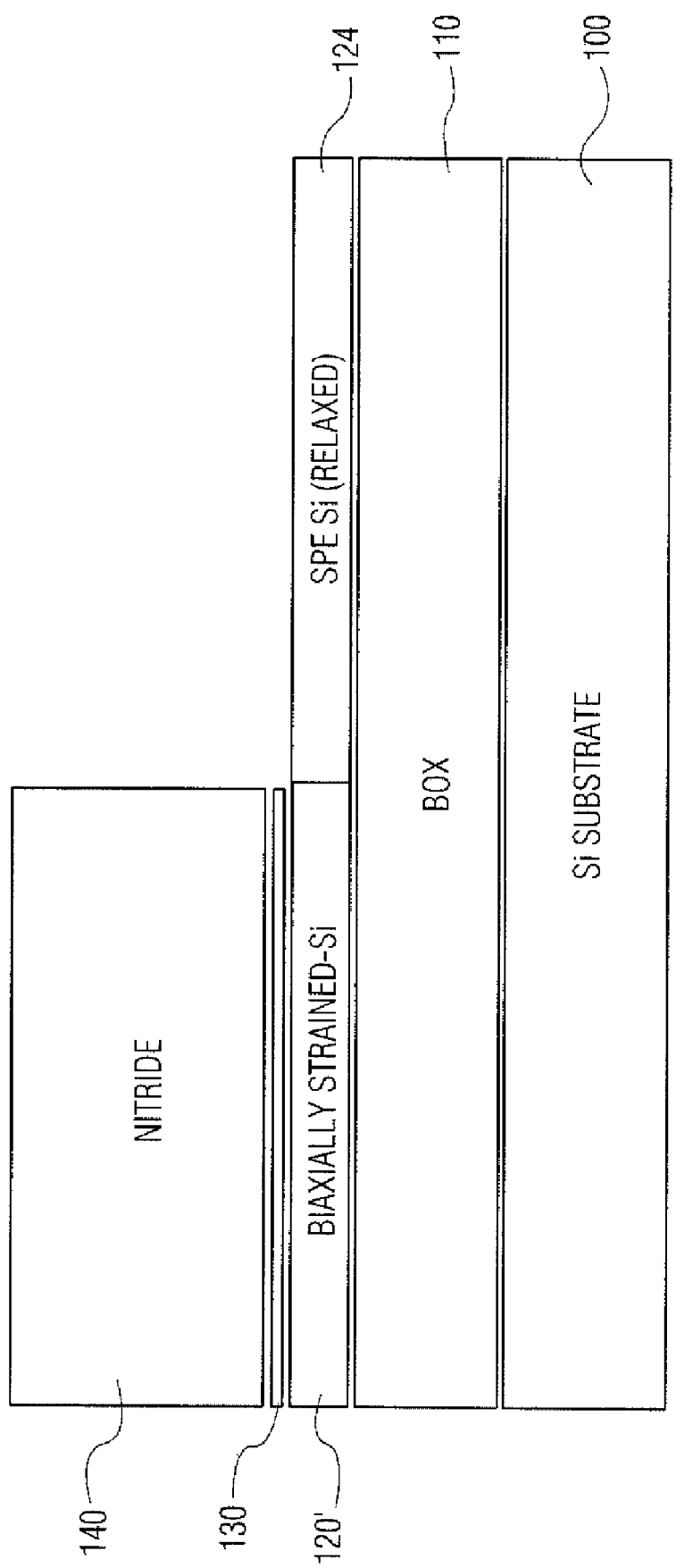

LOCALIZED STRAIN RELAXATION FOR STRAINED SI DIRECTLY ON INSULATOR

The present invention relates broadly to strained silicon (Si) directly on insulator (SSDOI), and more directly to a method of forming biaxial strained silicon on insulator semiconductor substrate to include localized regions of relaxed Si.

BACKGROUND OF THE INVENTION

Biaxial tensile strained silicon (Si) directly on insulator (SSDOI) is a layer of silicon, typically disposed directly on dielectric layer formed on a semiconductor substrate, in which the silicon atoms are stretched beyond their normal interatomic distance. One way of straining silicon is to grow a layer of Si over a substrate of silicon germanium (SiGe). As the atoms in the Si layer align with the atoms in the SiGe layer, wherein the interatomic distances longer, atomic "links" become stretched, or strained (i.e., strained silicon). An increased distance between stretched or strained atoms reduces the atomic forces that interfere with the movement of electrons through transistors formed in the SSDOI, i.e., increased electron mobility when properly biased. The increased electron mobility results in improved transistor operation, and lower energy consumption thereby. For example, transistor devices fabricated in SSDOI exhibit increased electron velocity through the device upwards of seventy percent (70%). Where electrons traverse device conduction paths by around 70% results in upwards of a thirty-five percent (35%) decrease in the time required to switch.

Strained SSDOI substrates are formed by a combination of chemical vapor deposition (CVD) and layer transfer process. Precursors for the CVD process include silicon-derived silane and dichlorosilane, and germanium-derived germane, germanium tetrachloride and isobutylgermane. U.S. Pat. No. 7,314,790 ("the '790 patent"), commonly-owned and incorporated by reference herein, discloses a method of forming biaxial tensile strained SSDOI substrates. The strained SSDOI substrates include a Si-containing layer with any crystal orientation, where crystal orientation (where <100> is the most typical crystal orientation) and biaxial tensile strain. Biaxial tensile strain is a term used to describe a net stress caused by longitudinal and lateral tensile stresses induced in a Si layer at or during the SSDOI substrate formation.

While the increased electron mobility inherent in biaxial tensile strained SSDOI substrates is ideal for N-doped transistor operation, for example, increased switching speeds in NFET devices fabricated therewith, it is not ideal for P-doped operation, i.e., PFET devices fabricated on SSDOI. That is, biaxial SSDOI is not known to enhance hole mobility. For that matter, localized uniaxial compressive strained silicon, or relaxed SSDOI is known to dramatically enhance hole mobility when P-doped, which is ideal for PFET device operation.

Conventional processes for forming biaxial SSDOI, however, are not known to realize uniaxial compressive strain, or portions of SSDOI substrates with uniaxial compressive strain in order to realize an SSDOI substrate from which both NFET and PFET devices may be formed with enhanced respective electron and hole mobilities, and therefore improved switching speeds within the devices so formed.

SUMMARY OF THE INVENTION

The present invention provides to a method of modifying biaxial strained silicon on insulator (SSDOI) semiconductor substrate to form localized regions of relaxed Si in the biaxial SSDOI substrate.

The invention is directed to processing a SSDOI substrate comprising a biaxial tensile strained SI layer to form a relaxed Si region in the strained Si layer. The regions are defined by depositing and patterning a nitride hardmask on the layer above the strained region. The region that is to be relaxed receives no Nitride patterning. The strained Si layer or film should be sufficiently thick so that it is in a metastable state. Thereafter, silicon (Si), germanium (Ge) or Xenon (Xe) is implanted into the exposed region of the strained Si using various processing operations, for example, ion beam deposition, preferably at high temperature (up to 500 degrees Centigrade). After implantation into the biaxial strained layer (not masked with the Nitride patterning), the formally strained Si becomes "relaxed." For that matter, where the implantation step is controlled to be below the amorphization threshold, the implantation may be carried out without raised temperature control.

In its preferred form, the invention comprises a method of forming a localized region of relaxed Si within a biaxial strained Si layer, or strained silicon directly on insulator (SSDOI) semiconductor substrate. The biaxial strained Si layer is disposed upon a buried oxide (BOX) layer in the embodiment shown, where the BOX layer is disposed on a Si substrate base. The method includes depositing a nitride hard mask pattern above a region of the biaxial strained Si layer in which enhanced electron mobility is desired, leaving an unmasked region of the biaxial strained Si in the layer. Once defined, the unmasked region is further processed in accordance with the following step branches (a), (b) or (c).

In step branch (a), the method further includes implanting high temperature silicon (Si I/I) within the unmasked region of the strained Si layer, to realize the localized relaxed Si region (which may include defects therein), amorphization implanting one of Si, Ge or Xe at normal temperature into the localized relaxed Si region, modifying the region to comprise an amorphous silicon layer (region) above a thinner localized relaxed Si layer (region). The thinner Si Layer is positioned above the BOX layer. The nitride hard mask pattern is stripped and the SSDOI substrate surface cleaned. The cleaned SSDOI substrate is exposed to solid-phase epitaxial annealing to crystallize the amorphous Si region and realize the relaxed SPE Si region proximate the strained region.

In step branch (b), the method further includes growing an EPI Si layer upon the unmasked region of the strained Si layer (to be relaxed), using pre-amorphization implantation. The pre-amorphization implantation a relaxed EPI Si region and a buried amorphous Si region are formed. The amorphous silicon region is formed below the relaxed EPI Si region (which may include defects), and above the buried oxide layer. Using SPE regrowth, the amorphous Si region is modified to realize a SPE Si (relaxed) region, below the relaxed EPI Si region. An oxidation step removes most or all of the EPI Si (relaxed) region, and may thin down part of the SPE Si (relaxed) region just below the EPI Si region to realize an oxide region, and a thinner SPE Si (relaxed) region, disposed below oxide region. The method then includes stripping the nitride pattern and oxide region.

In step branch (c), the method further includes selectively growing an EPI SiGe region on the unmasked region of the strained Si layer. Using pre-amorphization implantation, modifying the EPI SiGe region to be layered, where a first layer is EPI SiGe (region), a second layer below the first layer is an amorphous SiGe layer (region) and a third layer below the amorphous SiGe layer is an amorphous Si layer (region). Using SPE regrowth, the amorphous SiGe layer and the amorphous Si layer are modified to realize an SPE SiGe layer (region) and a SPE Si layer (relaxed) region. The SiGe layer and SPE SiGe layer are etched to leave the SPE Si (relaxed) region above the buried oxide layer, and stripping the nitride pattern.

BRIEF DESCRIPTION OF THE DRAWING FIGURES

The present invention is illustrated by way of example and not limitation in the figures of the accompanying drawings. The same numbers are used throughout the figures to reference like components and/or features.

FIGS. 1A-1D together depict a first embodiment of a method of forming localized regions of relaxed SI on a biaxial tensile strained silicon directly on insulator (SSDOI) semiconductor substrate;

FIGS. 2A-2E together depict a second embodiment of a method of forming localized regions of relaxed SI on a biaxial tensile strained silicon directly on insulator (SSDOI) semiconductor substrate;

FIGS. 3A-3E together depict a third embodiment of a method of forming localized regions of relaxed SI on a biaxial tensile strained silicon directly on insulator (SSDOI) semiconductor substrate; and FIGS. 4A-4E together depict a fourth embodiment of a method of forming localized regions of relaxed SI on a biaxial tensile strained silicon directly on insulator (SSDOI) semiconductor substrate

DETAILED DESCRIPTION OF THE INVENTION

While the below detailed description for forming biaxial tensile strained SSDOI semiconductor substrate with localized regions of relaxed Si is described with respect to <110> Si, the exemplary description with the particular orientation is presented for ease of explanation only, to convey the inventive substance or improvement but the exemplary description with the particular orientation is not meant to limit the scope of the invention application only to SSDOI semiconductor substrates with <110> Si surface orientation. The inventive method is intended to process SSDOI substrates with other Si surface orientations, e.g., <100> Si, <111> Si, <010> Si, and <001>. without deviating from the scope and spirit of the invention.

In a first embodiment, the invention comprises a method of forming a localized region of relaxed Si within a biaxial tensile strained Si layer (120) comprising a strained silicon directly on insulator (SSDOI) semiconductor substrate. The method steps for the first embodiment are depicted by FIGS. 1A-1D. The method operates on an SSDOI substrate comprising a strained Si layer (120), disposed upon a buried oxide layer or BOX (110). The BOX (110) is disposed on a Si substrate base (100). FIG. 1A depicts an thermal oxidation step to form a thin oxide layer (130) above strained Si layer (120).

Figure 1B:
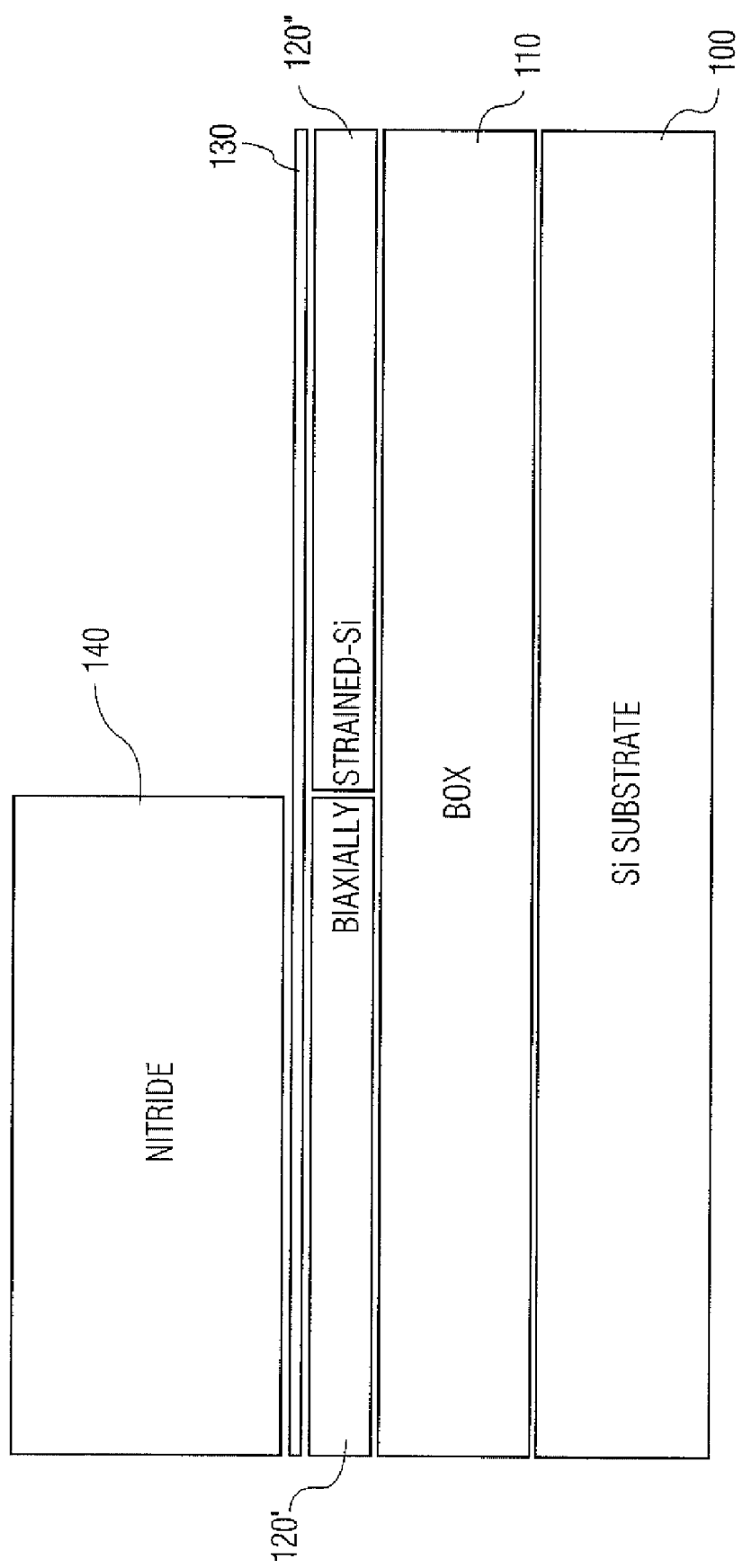
Figure 1C:
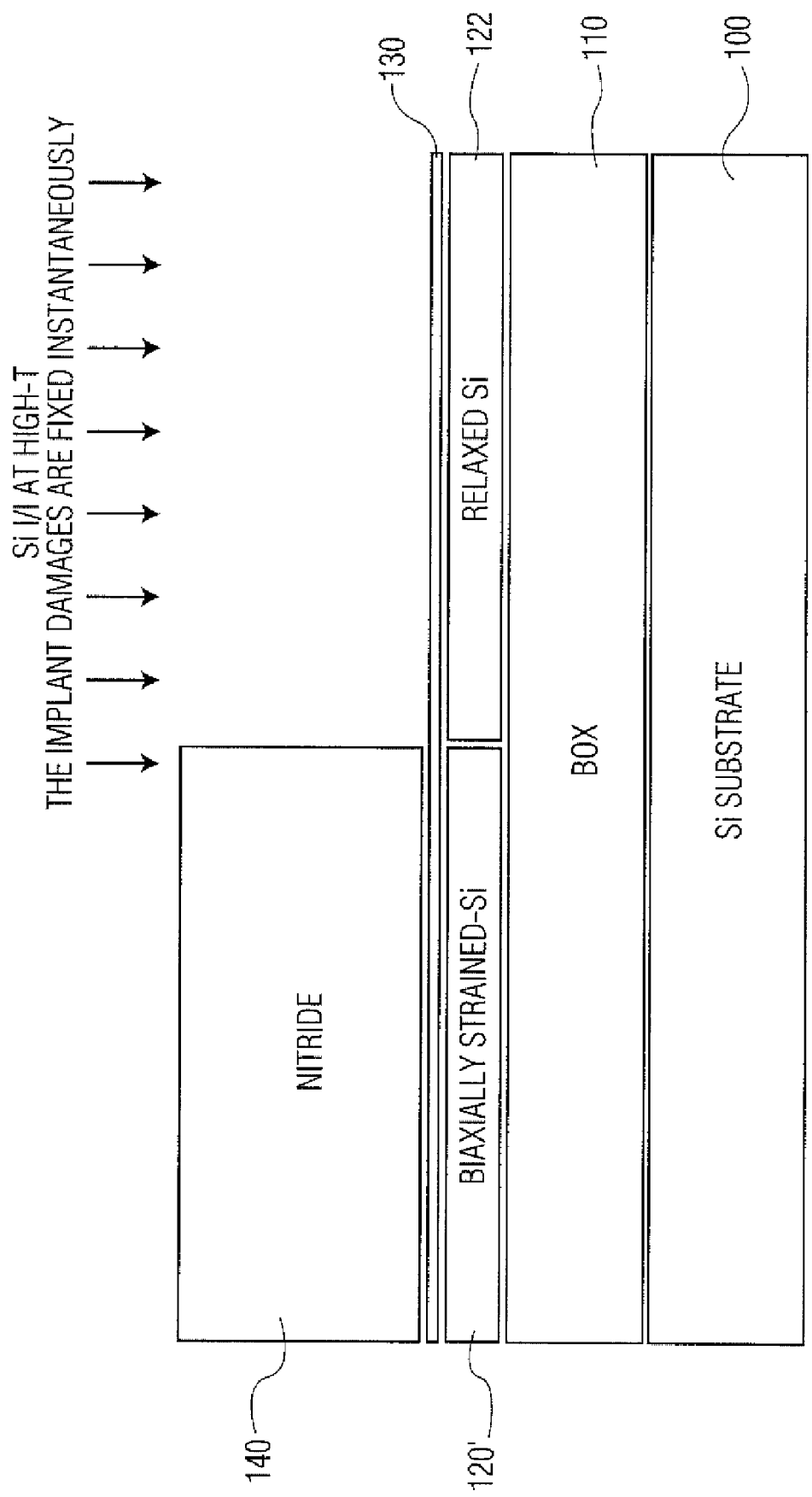

FIG. 1B depicts a step by which a nitride hard mask pattern (140) is deposited upon a region (120') of the strained Si layer (120), wherein enhanced electron mobility is desired to be maintained. The step leaves an unmasked region (120") above the strained Si layer, with a the thin oxide layer region (130) therebetween. The Nitride mask is required, for example, in lieu of photoresist, because photoresist cannot withstand high temperature ion implantation. FIG. 1C depicts a step of high temperature ion implantation, which implants silicon (Si I/I) at high temperature into the unmasked region (120") of the strained Si layer (120). As used herein, high temperature means a temperature range of between 100 and 500 degrees Centigrade (° C.). Because of the nitride mask (140), the strained silicon region (120') is unaffected by the Si implantation. The exposed or unmasked region (120") of the strained Si layer (120) is "relaxed" by the ion implantation, realizing relaxed localized Si region (122) as shown in FIG. 1C.

Figure 1D:
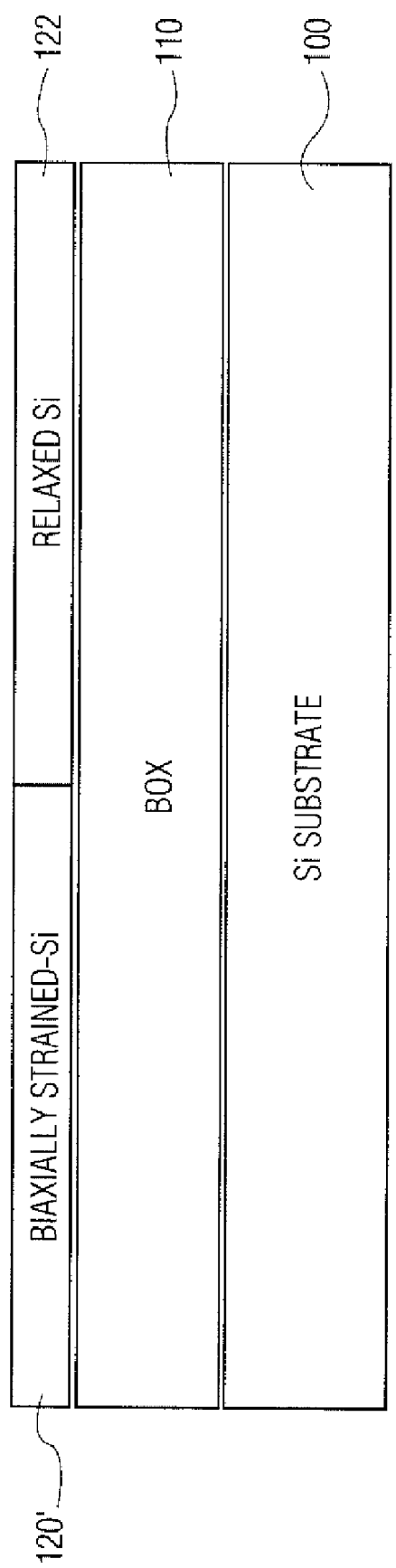

FIG. 1D depicts a step of stripping the oxide layer (130), and the nitride hard mask pattern (140) from above the unstrained region (120') of the strained Si layer. NFETs may be fabricated utilizing the strained Si layer in the substrate, and PFETs fabricated utilizing the localized relaxed Si region. As already mentioned, NFETs so formed utilizing strained regions display enhanced electron mobility, and PFETs formed using the relaxed regions display enhanced hole mobility when property biased.

A second embodiment of the method of forming a localized region of relaxed Si (120") in a strained Si layer (120) of an SSDOI semiconductor substrate is depicted by FIGS. 2A-2E. The second embodiment requires first preparing the starting substrate and strained Si layer (120) in accordance with the first three steps of the first method embodiment (FIGS. 1A-1C). That is, the second embodiment begins after formation of the relaxed Si region (122) in biaxial strained layer (120) next to strained Si region (120') under the nitride hard mask pattern (140). Both the strained and relaxed regions are disposed below the thin Oxide layer (130). The second embodiment accounts for any defects that might be caused by the high temperature Si I/I implantation to form the relaxed Si region (122), as shown.

Figure 2A:
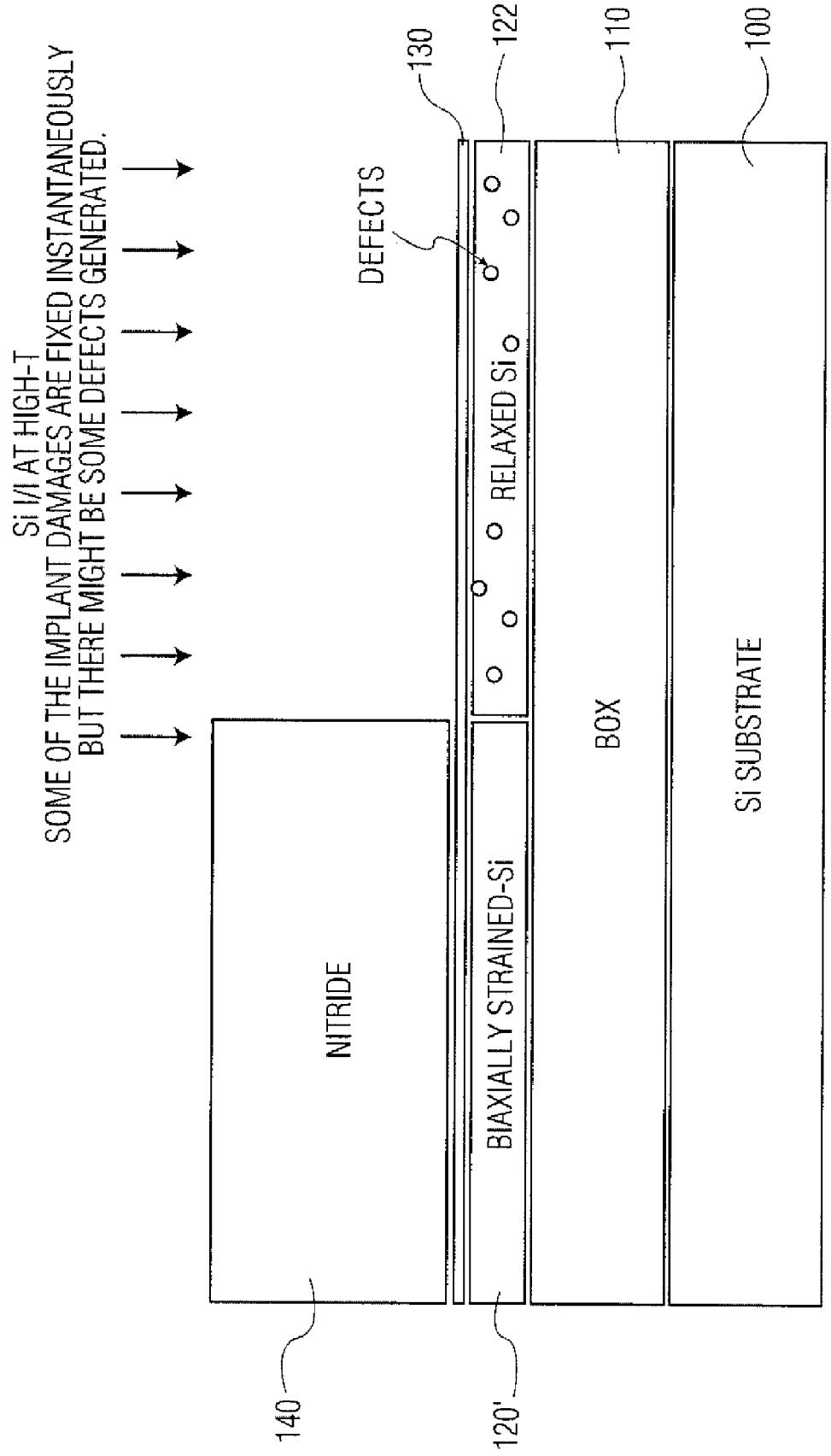
Figure 2B:
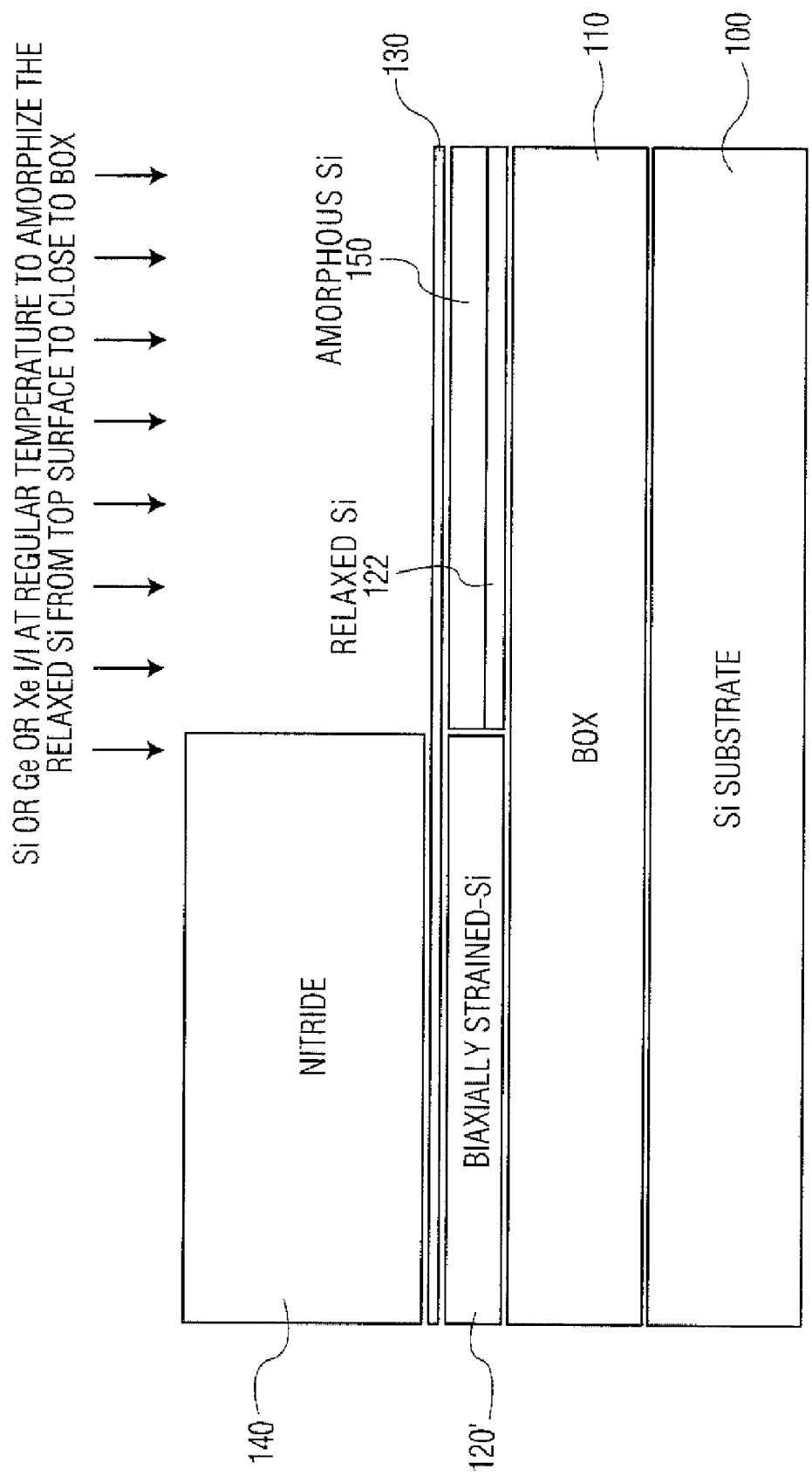
Figure 2C:
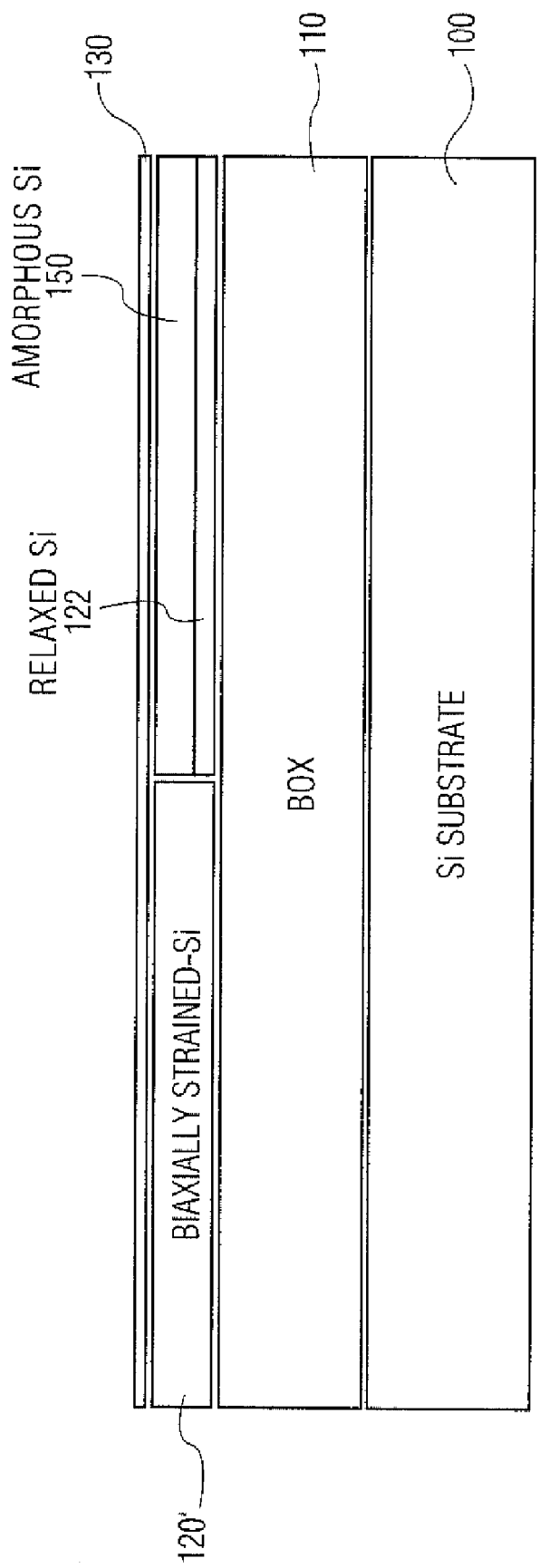
Figure 2D:
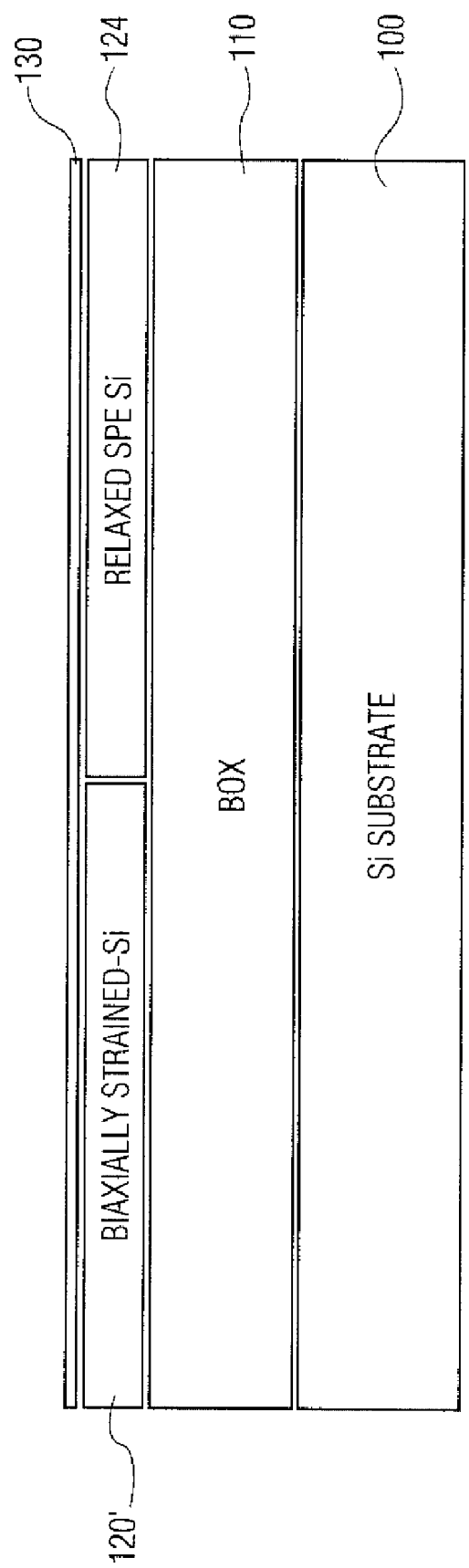
Figure 2E:
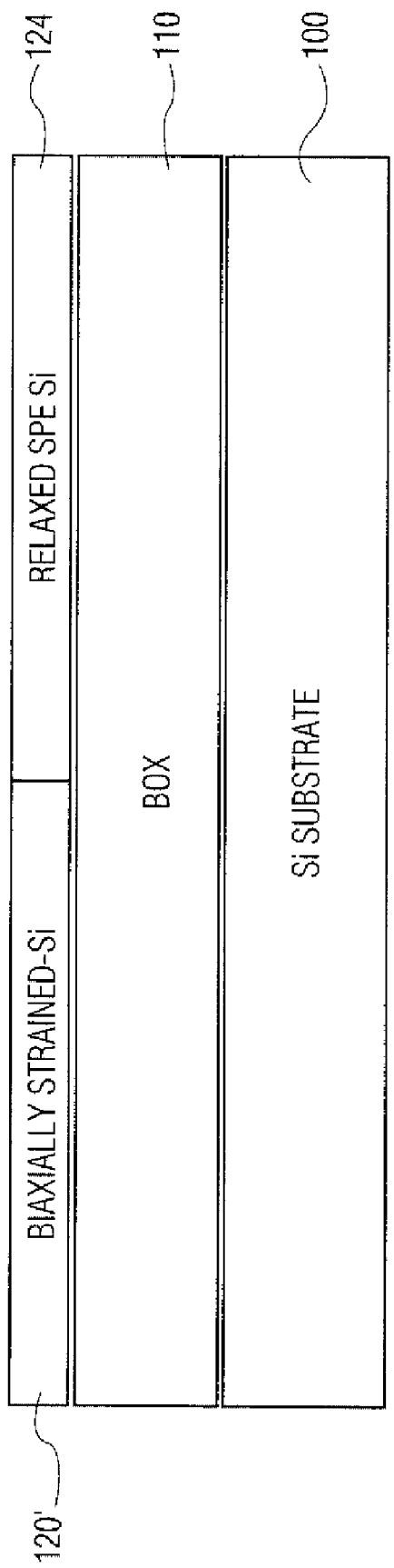

FIG. 2B depicts an amorphization implantation step (after Si I/I implantation at high temperature), whereby one of Si, Ge or Xe ions is implanted at normal temperature into the relaxed localized Si region (122), which might have defects. This amorphization implantation step forms an amorphous silicon layer (150) just below thin oxide layer (130), and leaves a thin layer of relaxed Si (122), disposed above the BOX layer (110). FIG. 2C depicts a step of cleaning and nitride stripping, which leaves oxide layer (130) above the biaxial strained Si region (120') and above the proximate region comprising the amorphous Si layer (150) above the thin relaxed Si layer (122). Thereafter, the SSDOI substrate is subjected to a solid-phase epitaxial annealing, the step shown in FIG. 2D. The step anneals or crystallizes the amorphous Si layer region (150) to realize the relaxed SPE Si layer region (124). The oxide layer (130) is then stripped, the step of stripping shown in FIG. 2E.

Figure 3A:
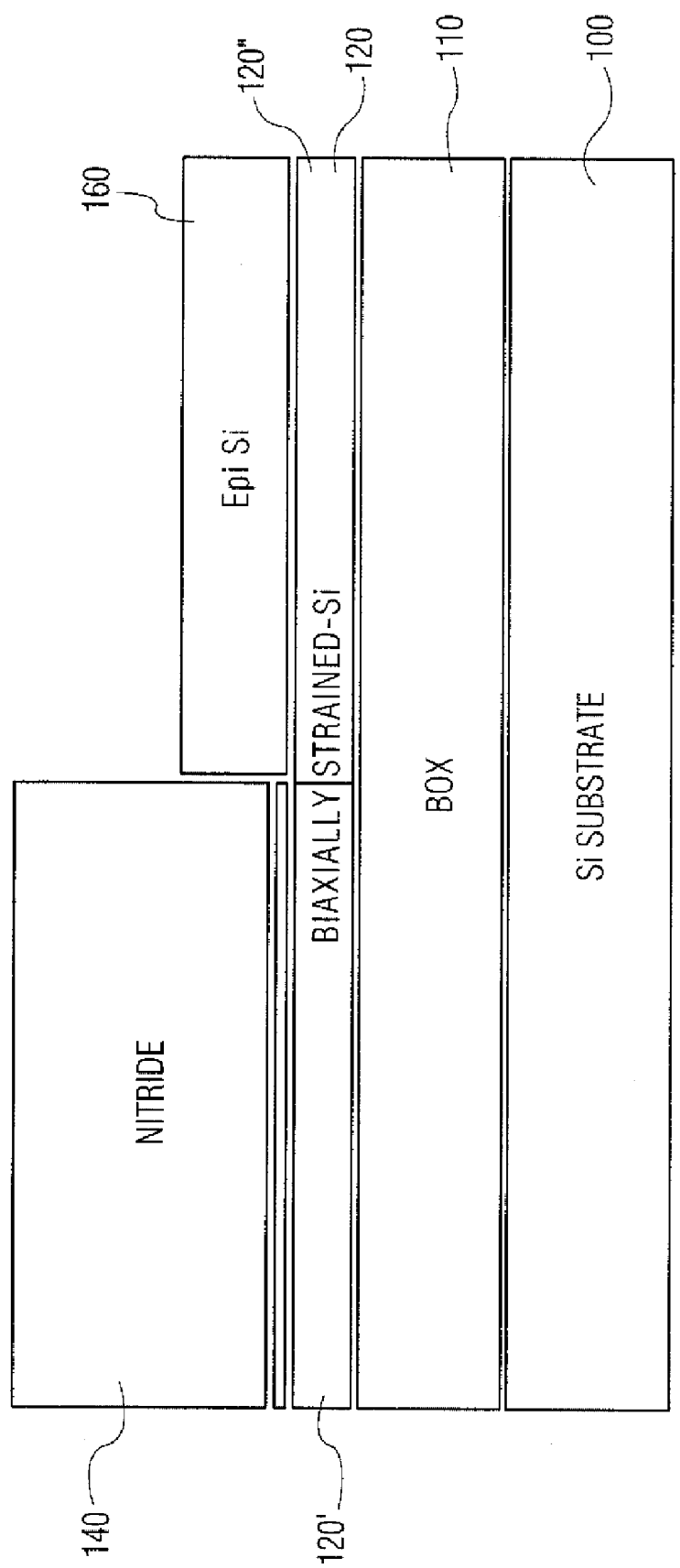
Figure 3B:
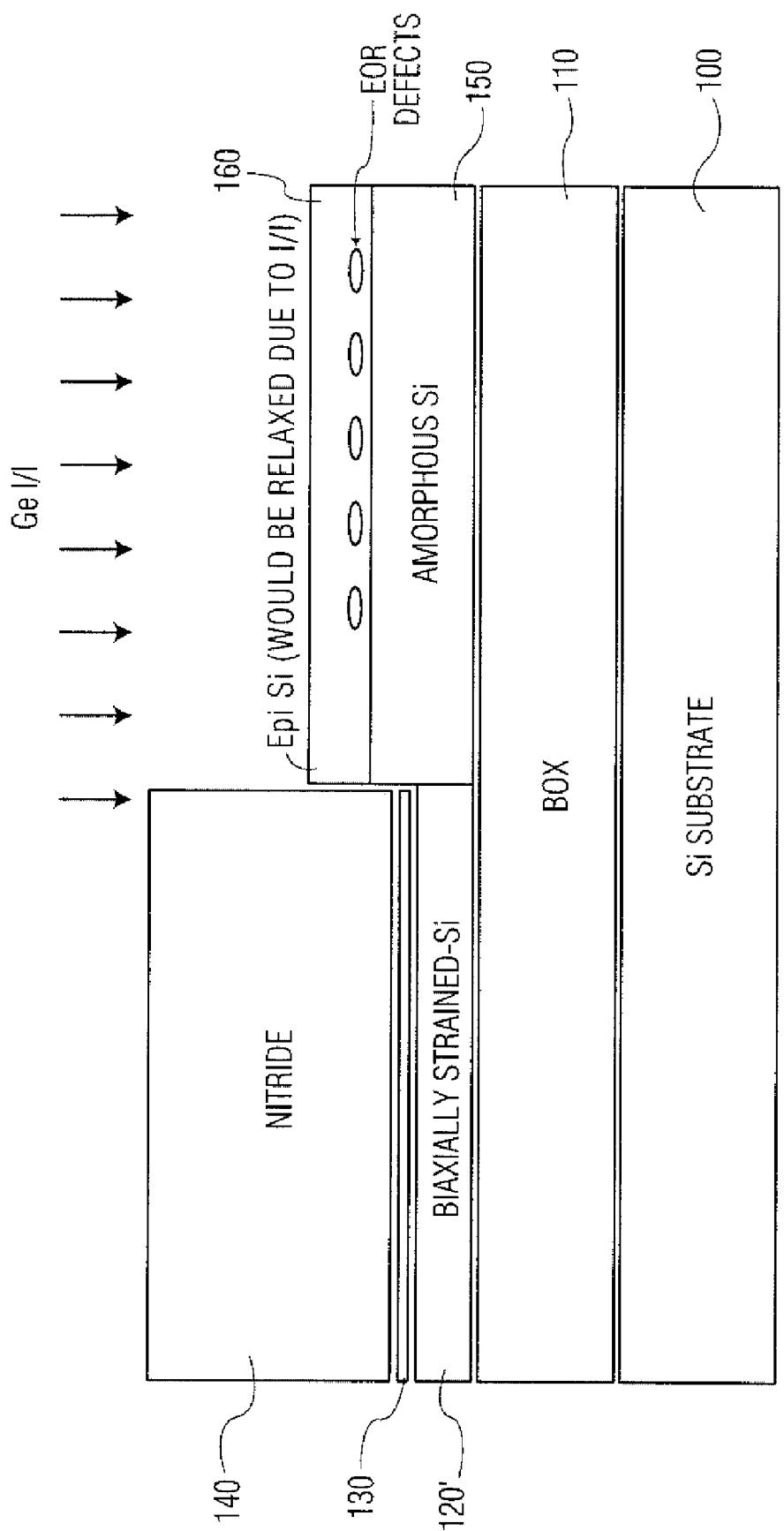

A third embodiment of forming a localized region of relaxed SPE Si in the strained Si layer (120) of an SSDOI semiconductor substrate is depicted by FIGS. 3A-3E. The third method embodiment requires first preparing the strained Si layer in accordance with the first two steps of the first and second method embodiments, set forth and shown respectively in FIGS. 1A and 1B. That is, the third embodiment processes the SSDOI substrate after the nitride mask pattern is deposited above region (120') of biaxial strained Si layer (120), leaving an exposed region (120") in same biaxial strained layer to be relaxed. As depicted in FIG. 3A, a Si epitaxial growth step is performed on the SSDOI substrate that includes selectively growing an (EPI) Si region (160) above unmasked region (120"). FIG. 3B depicts a pre-amorphization implantation step, where the EPI Si region (160) and strained region (122') are processed with Ge I/I to form a buried amorphous Si region (150) in part of the EPI Si region (160), and in the formally stained Si region (120"). The amorphous Si region (150) is shown disposed above the BOX layer (110). The now thinner EPI Si region, disposed the amorphous Si region (150), is thereby relaxed, and shown in FIG. 3B to include defects.

Figure 3C:
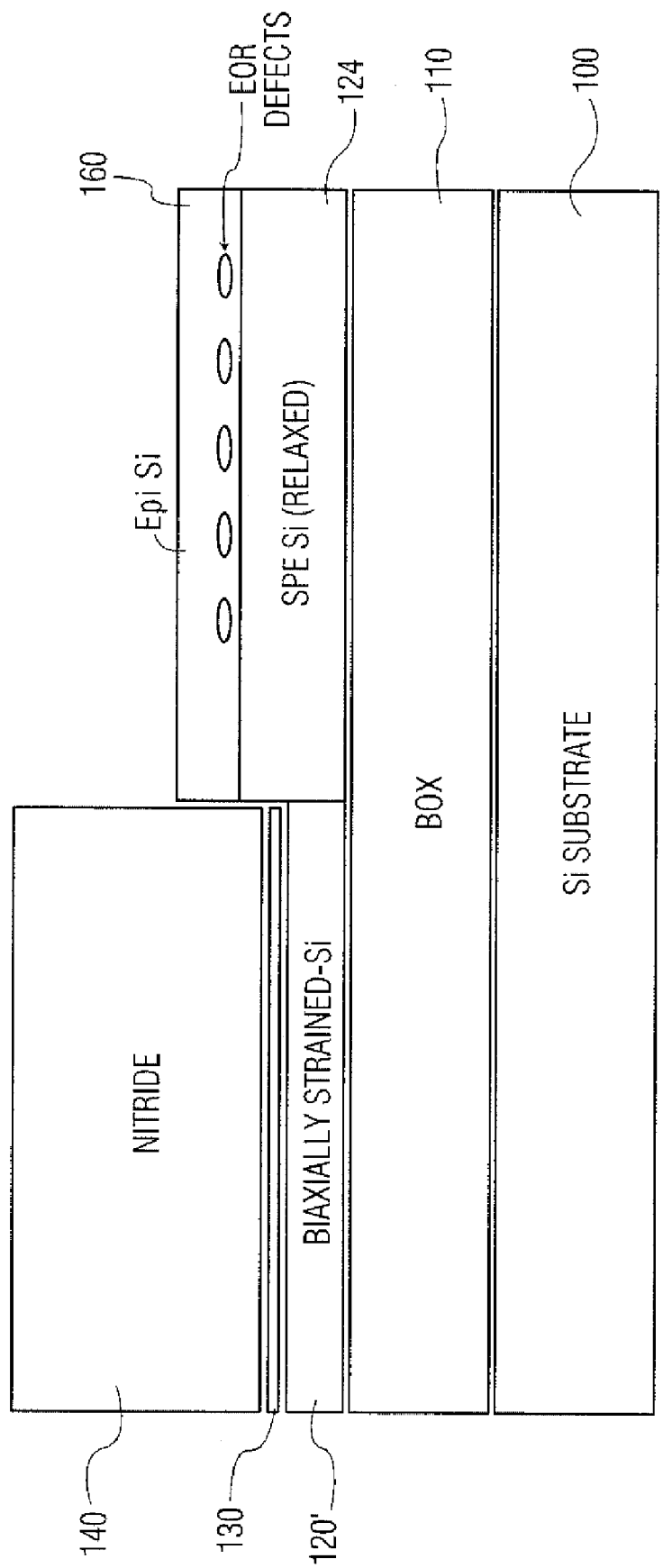
Figure 3D:
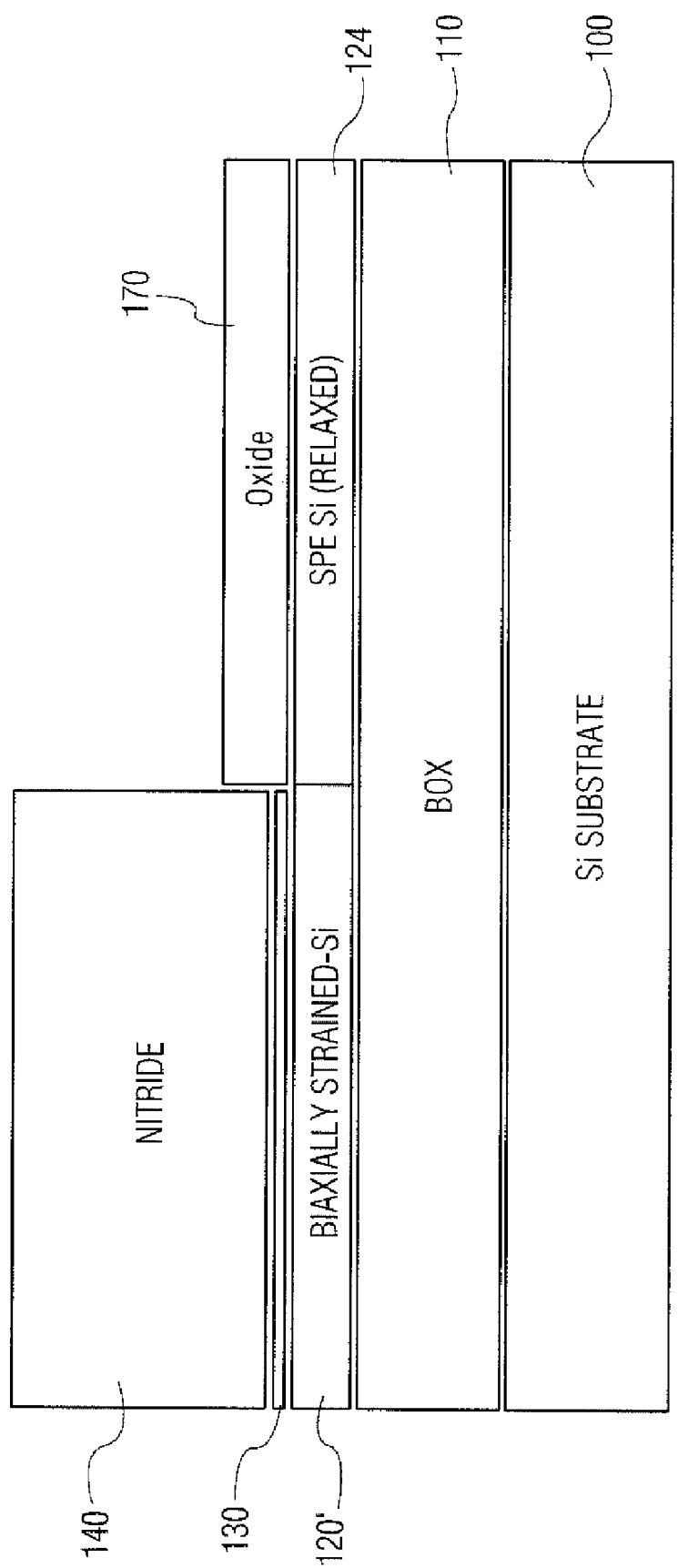
Figure 3E:
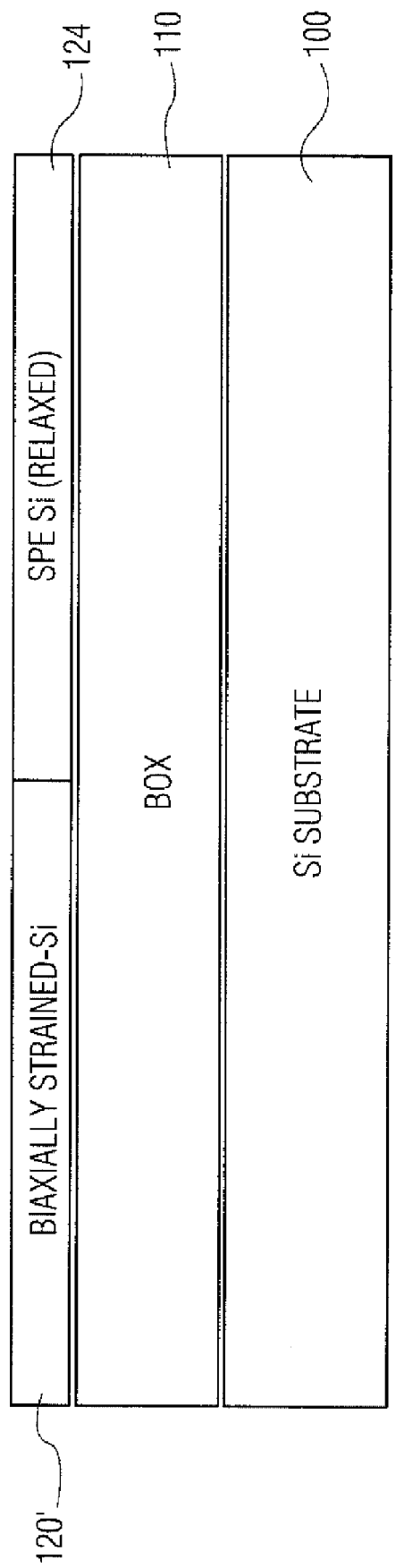

FIG. 3C depicts an SPE regrowth step. The SPE regrowth step modifies the amorphous Si region (150) layer to realize a relaxed SPE Si region (124), just below the thinner EPI Si region (160) with end-of-range (EOR) defects, and above the BOX layer (110). An oxidation step is then carried out, as depicted in FIG. 3D. The FIG. 3D oxidation step oxidizes the EPI Si region (160) to remove EOR defects, and thins down part the relaxed SPE Si layer just below the EPI Si region. The step realizes a thinner relaxed SPE Si region (124), disposed above the BOX layer (110), with a substantial oxide region (170) disposed above the thinner, relaxed SPE Si region (124). No solid-phase epitaxial annealing step is carried out in the third method embodiment. FIG. 3E depicts a step of stripping the oxide layer (170) above relaxed SPE Si region (124), and the nitride pattern (140) and any oxide region (130) above the biaxial strained Si region (120').

Figure 4A:
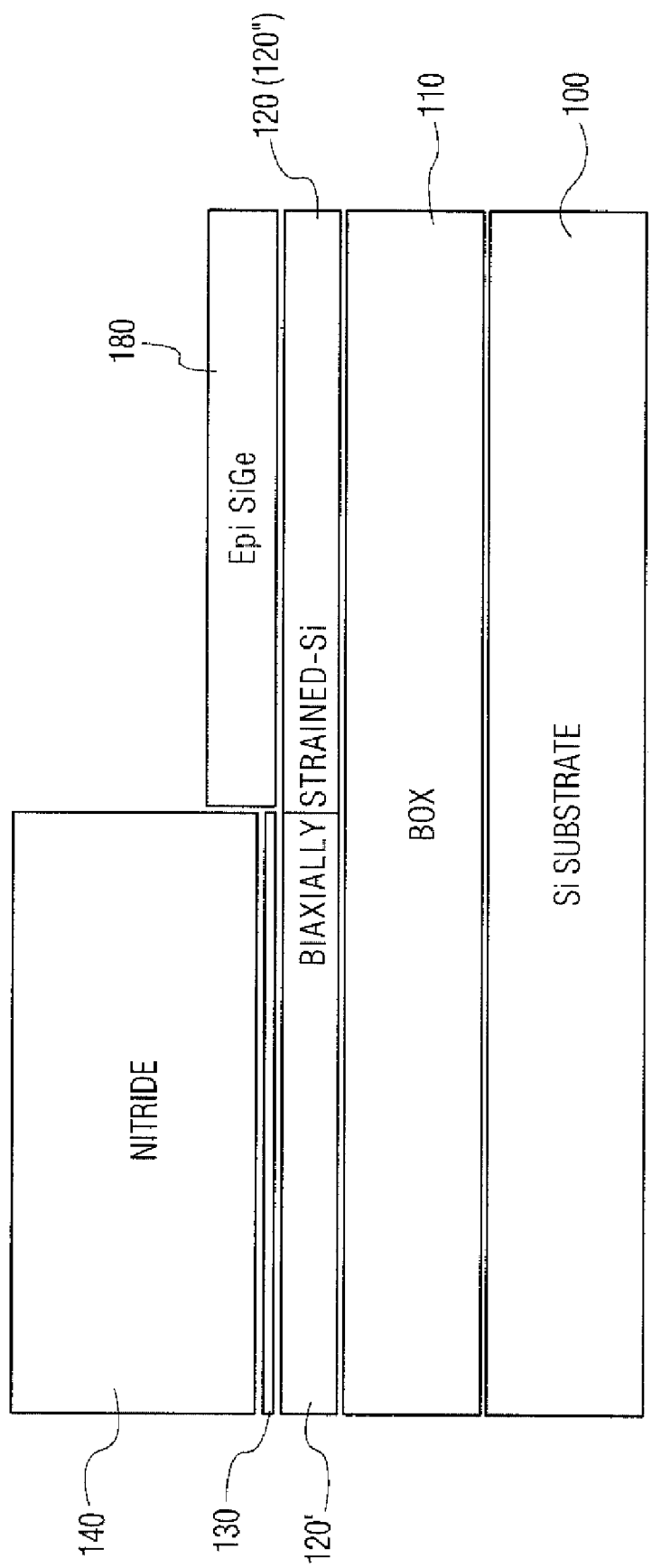
Figure 4B:
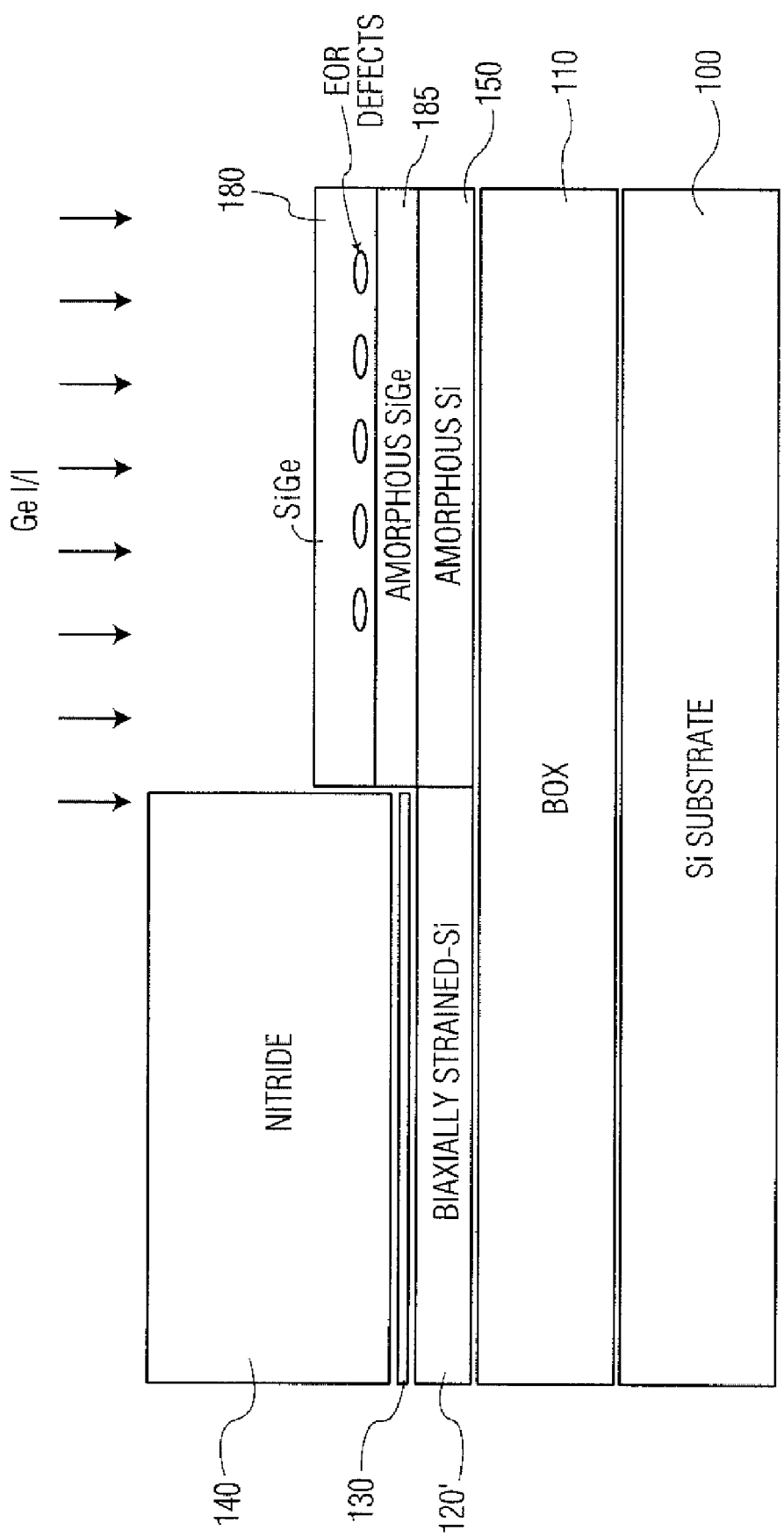

A fourth embodiment of the method of forming a localized region of relaxed Si in a biaxial strained SI layer comprising an SSDOI semiconductor substrate is depicted by FIGS. 4A-4E. The fourth method embodiment requires first preparing the strained Si layer (120) in accordance with the first two steps of the first, second and third method embodiments, depicted in FIGS. 1A and 1B. FIG. 4A depicts a step of depositing an EPI SiGe region (180) above the unmasked region of region (120") in the strained Si layer (120) of an SSDOI substrate (such as shown in FIG. 2B). A pre-amorphization implanting step is depicted in FIG. 4B, where Ge I/I is implanted into the EPI SiGe region (180) and strained Si layer (120") to form a buried amorphous SiGe region (185), below at thinned EPI SiGe region (180), and an amorphous Si region (150) below the amorphous SiGe layer (185), as shown.

Figure 4C:
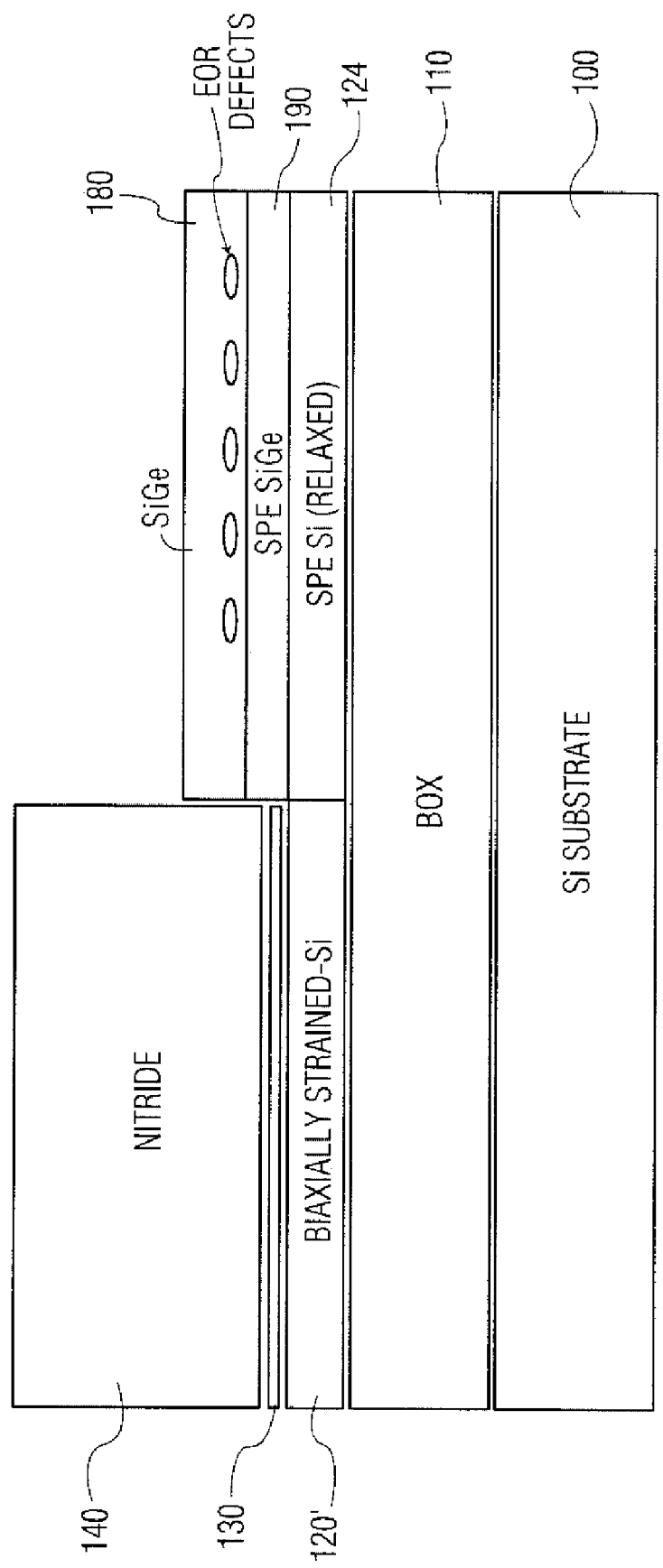
Figure 4E:
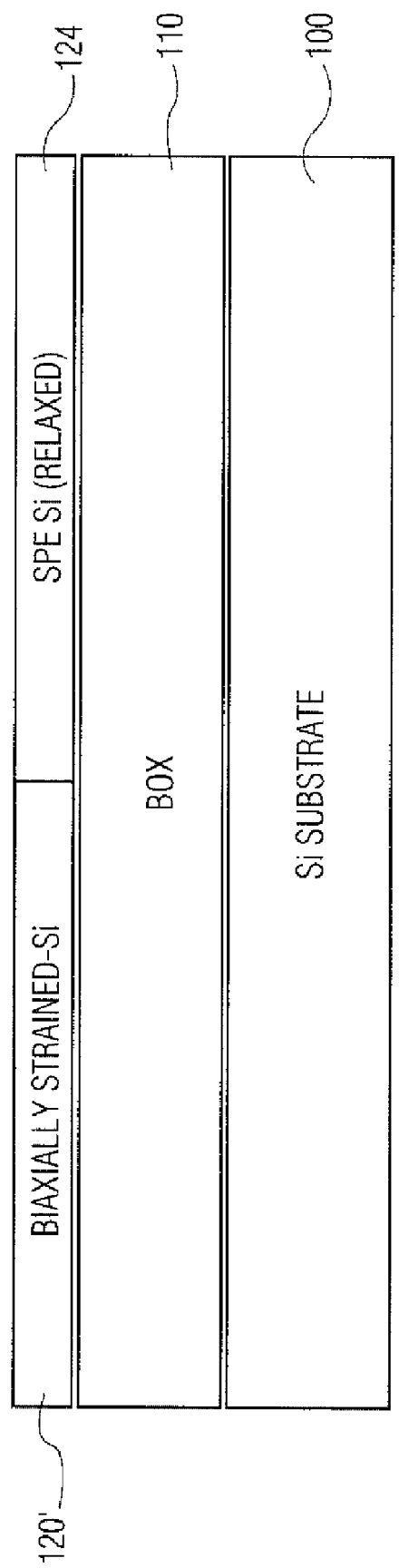

FIG. 4C depicts an SPE regrowth step to modify the amorphous Si region (150) to realize a relaxed SPE Si region (124), and modify the amorphous SiGe region (185) to realize SPE SiGe region (190). The SiGe region (180) and SPE SiGe region (190) are etched, as shown in FIG. 4D, leaving the relaxed SPE Si region (124) exposed as shown. FIG. 4E depicts a step of stripping the nitride region (140) and oxide layer region (130) disposed above biaxial strained Si region (120'), which may also include stripping a very thin layer of relaxed SPE Si region (124). The result SSDOI semiconductor substrate is thus formed with a strained Si region (120') proximate a relaxed Si region (124) formed within the same strained layer (120).

Although examples of the present invention have been shown and described, it would be appreciated by those skilled in the art that changes may be made in these embodiments without departing from the principles and spirit of the invention, the scope of which is defined in the claims and their equivalents.

What is claimed is:

1. A method of forming a localized region of relaxed Si within a strained Si layer comprising strained silicon directly on insulator (SSDOI) semiconductor substrate, the strained Si layer formed on a buried oxide (BOX) layer disposed on a SI substrate base, the method comprising steps of:

forming a thin oxide layer on the strained Si layer using heat;

depositing a nitride hard mask pattern upon the thin oxide layer above a region in the strained Si layer in which enhanced electron mobility is desired, the hard mask pattern leaving an exposed region on the thin oxide layer above the strained Si layer in which enhanced hole mobility is desired;

performing one of step branches (a), (b) or (c):

(a):
  implanting high temperature silicon (Si I/I) into the unmasked region of the strained Si layer to realize a localized relaxed Si region;
  amorphization implanting one of Si, Ge or Xe at normal temperature into the localized relaxed Si region to form an amorphous silicon layer above a thinner localized relaxed Si layer;
  stripping the nitride hard mask pattern, and cleaning; and
  solid-phase epitaxial annealing to crystallize the amorphous silicon region and realize a relaxed SPE Si region from the thinner localized relaxed Si layer and amorphous Si layer;

(b):
  selectively growing an EPI Si region upon the unmasked region of the strained Si layer;
  using pre-amorphization implantation, modifying the EPI Si region and the unmasked region of the strained Si layer to realize a buried amorphous Si region below a thinner relaxed EPI Si region;
  using SPE regrowth, modifying the buried amorphous Si region to realize a relaxed SPE Si region, below thinner relaxed EPI Si region; and
  oxidizing the thinner relaxed EPI Si region, and part of the relaxed SPE Si region to realize an oxide region, and a thinner relaxed SPE Si region below the formed oxide region; and
  stripping the nitride pattern and oxide region;

(c):
  growing an EPI SiGe region on an unmasked region of the strained Si layer;
  using pre-amorphization implantation of Ge I/I, forming a buried amorphous SiGe region in a portion of the EPI SiGe region, and an amorphous Si region, in what was the strained Si region below the amorphous silicon region;
  using SPE regrowth, modifying the amorphous SiGe and amorphous Si regions to realize respective SPE SiGe and relaxed SPE Si regions, both below the EPI SiGe region;
  etching the EPI SiGe and SPE SiGe regions to leave the relaxed SPE Si region above the buried oxide layer; and
  stripping the nitride pattern.

2. The method as set forth in claim 1, wherein the surface orientation of the silicon is any from a group of <110> Si, <100> Si, <111> Si, <011> Si, and <001>.

* * * * *